United States Patent
Yoshihashi et al.

(10) Patent No.: US 9,208,863 B1
(45) Date of Patent: Dec. 8, 2015

(54) MEMORY SYSTEM AND METHOD OF CONTROLLING MEMORY SYSTEM

(71) Applicant: Kabushiki Kaisha Toshiba, Minato-ku (JP)

(72) Inventors: Eiji Yoshihashi, Yokohama (JP); Hiroki Matsudaira, Funabashi (JP); Ryuji Nishikubo, Kawasaki (JP); Norio Aoyama, Machida (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/472,701

(22) Filed: Aug. 29, 2014

Related U.S. Application Data (60) Provisional application No. 62/000,041, filed on May 19, 2014.

(51) Int. Cl.
  *G11C 16/04* (2006.01)
  *G11C 11/56* (2006.01)
(52) U.S. Cl.
  CPC .................................. *G11C 11/5628* (2013.01)
(58) Field of Classification Search
  USPC .............. 365/185.03, 185.17, 185.18, 189.07
  See application file for complete search history.

(56) References Cited

U.S. PATENT DOCUMENTS

| | | | | |
|---|---|---|---|---|
| 7,397,686 B2* | 7/2008 | Takashima et al. | ........... | 365/145 |
| 7,729,166 B2* | 6/2010 | Kim et al. | ................ | 365/185.03 |
| 7,984,325 B2 | 7/2011 | Fukutomi et al. | | |
| 8,069,301 B2 | 11/2011 | Fukutomi et al. | | |
| 8,174,902 B2* | 5/2012 | Lee et al. | ................ | 365/185.25 |
| 8,479,085 B2* | 7/2013 | Jo et al. | ........................ | 714/795 |
| 2013/0246887 A1 | 9/2013 | Torii et al. | | |

FOREIGN PATENT DOCUMENTS

| | | |
|---|---|---|
| JP | 2010-15197 | 1/2010 |
| JP | 5242264 | 7/2013 |
| JP | 2013-225830 | 10/2013 |

* cited by examiner

*Primary Examiner* — Pho M Luu
(74) *Attorney, Agent, or Firm* — Oblon, McClelland, Maier & Neustadt, L.L.P.

(57) ABSTRACT

A controller performs a coding process based on a first frame including data of a plurality of pages connected to first word lines being a predetermined number of consecutive word lines in a block, and performs, when padding data is written to a plurality of pages connected to second word lines being the predetermined number of word lines subsequent to the first word lines, the coding process based on a second frame obtained by excluding the padding data from a frame including data of the pages connected to the second word lines.

16 Claims, 7 Drawing Sheets

FIG.2

| WL | L | M | U |
|---|---|---|---|
| 0 | | | |
| 1 | | | |
| 2 | | | |
| 3 | | | |
| 4 | | | |
| 5 | | | |
| 6 | | | |
| 7 | | | |
| 8 | | | |
| 9 | | | |
| 10 | | | |
| 11 | | | |
| 12 | | | |
| 13 | | | |
| 14 | | | |
| 15 | | | |

- WL 0–3: ECC FRAME E1
- WL 4–7: ECC FRAME E2
- WL 8–10: PADDING DATA
- WL 11: ECC FRAME E3 (SHORT FRAME)
- WL 12–15: ECC FRAME E4

FIG.3

| WL | Lower | Middle | Upper |
|---|---|---|---|
| WL0 | 0 | 2 | 5 |
| WL1 | 1 | 4 | 8 |
| WL2 | 3 | 7 | 11 |
| WL3 | 6 | 10 | 14 |
| WL4 | 9 | 13 | 17 |
| WL5 | 12 | 16 | 20 |
| WL6 | 15 | 19 | 23 |
| WL7 | 18 | 22 | 26 |
| WL8 | 21 | 25 | 29 |
| WL9 | 24 | 28 | 32 |
| WL10 | 27 | 31 | 35 |
| WL11 | 30 | 34 | 38 |
| WL12 | 33 | 37 | 41 |
| ⋮ | ⋮ | ⋮ | ⋮ |
| WL75 | 222 | 226 | 230 |
| WL76 | 225 | 229 | 233 |
| WL77 | 228 | 232 | 236 |
| WL78 | 231 | 235 | 239 |
| WL79 | 234 | 238 | 242 |
| WL80 | 237 | 241 | 245 |
| WL81 | 240 | 244 | 248 |
| WL82 | 243 | 247 | 251 |
| WL83 | 246 | 250 | 254 |
| WL84 | 249 | 253 | 256 |
| WL85 | 252 | 255 | 257 |

FIG.4

| WL | L | M | U | |
|---|---|---|---|---|
| 0 | D | D | D | ⎫ ECC FRAME E1 |
| 1 | D | D | D | |
| 2 | D | D | D | |
| 3 | D | D | D | ⎭ |
| 4 | D | D | Pd | ⎫ |
| 5 | D | Pd | Pd | |
| 6 | D | Pd | Pd | ECC FRAME E2 |
| 7 | Pd | Pd | Pd | |
| 8 | Pd | Pd | Pd | |
| 9 | Pd | Pd | Pd | |
| 10 | Pd | Pd | Pd | ⎭ |
| 11 | D | D | D | } ECC SHORT FRAME E3 |
| 12 | D | D | D | ⎫ |
| 13 | D | D | D | ECC FRAME E4 |
| 14 | D | D | D | |
| 15 | D | D | D | ⎭ |

D : Data
Pd : Padding data

MEMORY SYSTEM AND METHOD OF CONTROLLING MEMORY SYSTEM

CROSS-REFERENCE TO RELATED APPLICATIONS

This application is based upon and claims the benefit of priority from U.S. Provisional Patent Application No. 62/000,041, filed on May 19, 2014; the entire contents of which are incorporated herein by reference.

FIELD

This embodiment generally relates to a memory system provided with a non-volatile memory and a method of controlling the memory system.

BACKGROUND

In a storage system provided with the non-volatile memory such as a flash memory, when writing is finished partway through a block at the time of power shutdown and the like, padding data is written to a subsequent page of a page to which data is written in order to fix the data of which writing is finished or to secure reliability of the data of which writing is finished. The reliability of the padding data itself may be low because writing to the subsequent page is not performed when the padding data is written.

In this type of storage system, the reliability of the data is improved by using an error correcting code. However, the inclusion of such padding data with low reliability into the data which configures the error correcting code may impair the correcting capabilities of the error correcting code.

DETAILED DESCRIPTION

According to this embodiment, a memory system comprises a non-volatile memory and a controller. The non-volatile memory includes a plurality of blocks. Each of the blocks includes a plurality of word lines and a plurality of memory cells. Each of the word lines is connected to the memory cells. Each of the memory cells belongs to a plurality of pages. The controller performs a coding process based on a first frame including data of the pages connected to first word lines, the first word lines being a predetermined number of consecutive word lines in the block. When padding data is written to a plurality of pages connected to second word lines being the predetermined number of consecutive word lines subsequent to the first word lines, the controller performs a coding process based on a second frame obtained by excluding the padding data from a frame including data of a plurality of pages connected to the second word lines. When padding data is not written to the pages connected to the second word lines, the controller performs a coding process based on a third frame, the third frame including data of the pages connected to the second word lines.

The memory system and a method of controlling the memory system according to the embodiment will be explained below in detail with reference to the accompanying drawings. Meanwhile, the present invention is not limited to the following embodiment.

First Embodiment

Figure 1:
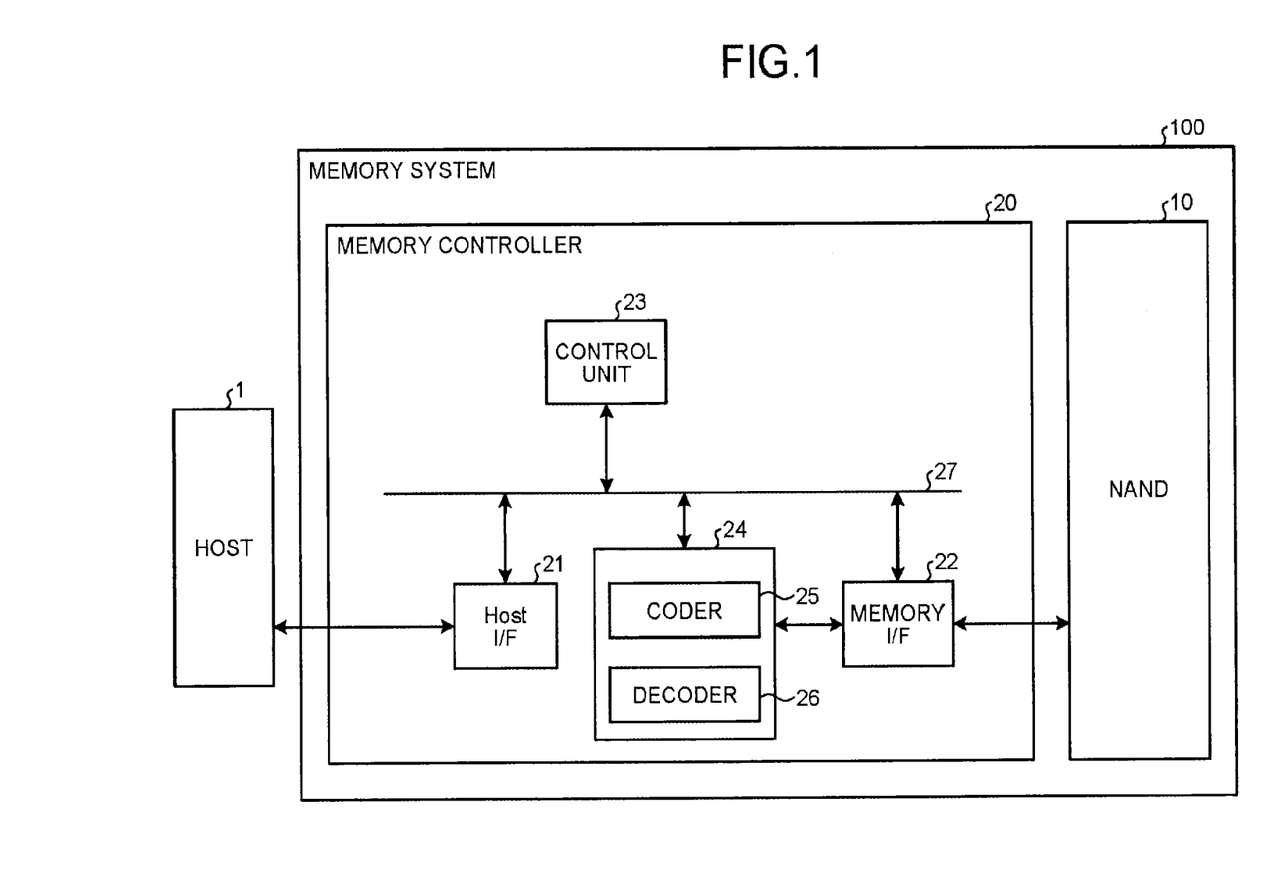
FIG. 1 is a functional block diagram of an internal configuration of a memory system.

FIG. 1 is a block diagram of a configuration example of an SSD (solid state drive) 100 as a memory system of a first embodiment. The memory system 100 is connected to a host device (hereinafter, abbreviated as host) 1 to serve as an external storage device of the host 1. The host 1 is a personal computer, a mobile phone, and an imaging device, for example.

The memory system 100 is provided with a NAND flash memory (hereinafter, abbreviated as NAND) 10 being a non-volatile memory and a memory controller 20.

The NAND 10 stores user data specified by the host 1. The NAND 10 includes one or a plurality of memory chips. The memory chip includes a memory cell array in which a plurality of memory cells is arranged in a matrix. When each of the memory cells is an MLC (multiple level cell) storage cell, two-bit information may be accumulated in one memory cell. When each of the memory cells is a TLC (triple level cell) storage cell, three-bit information may be accumulated in one memory cell.

Each of memory chips includes a plurality of physical blocks being units of data erasing. The physical block includes a plurality of physical pages. One physical block includes a plurality of memory cells connected to a plurality of word lines WL0 to WLn. In a case of the MLC and the TLC, a plurality of physical pages is connected to one word line in one block. In the case of the MLC, two pages which are a lower page and an upper page are connected to one word line in one block, and in the case of the TLC, three pages which are the lower page, a middle page, and the upper page are connected to one word line. In the NAND 10, write of data and read of data are performed with respect to each of the physical pages.

The non-volatile memory 10 is not limited to a non-volatile semiconductor memory such as the NAND flash and another non-volatile memory capable of storing the data such as a flash memory other than the NAND-type and a three-dimensional flash memory may also be adopted.

The memory controller 20 controls writing to the NAND 10 according to a write command from the host 1 and controls reading from the NAND 10 according to a read command from the host 1. The memory controller 20 is provided with a Host I/F 21, a memory I/F 22, a control unit 23, and a coder/decoder 24. The coder/decoder 24 is provided with a coder 25 and a decoder 26. The Host I/F 21, the memory I/F 22, the control unit 23, the coder 25, and the decoder 26 are connected to one another by means of an internal bus 27.

The Host I/F 21 performs a process in accordance with an interface standard between the same and the host 1 and outputs a command, the user data and the like received from the host 1 to the internal bus 27. The Host I/F 21 also transmits the user data read from the NAND 10 and a response from the control unit 23 to the host 1.

The memory I/F 22 controls a process to write write data to the NAND 10 and a process to read the data from the NAND 10 based on an instruction of the control unit 23.

The control unit 23 generally controls each component of the memory system 100. When the control unit 23 receives the command from the host 1 through the Host I/F 21, the control unit 23 controls the each component according to the command. For example, the control unit 23 gives the memory I/F 22 an instruction to write the user data and parity to the NAND 10 and to read the user data from the NAND 10 according to the command from the host 1.

The coder 25 performs an error correcting coding process to generate the parity based on the data transferred to the internal bus 27. Any code may be used as an error correcting code; a BCH code, an RS (Reed-Solomon) code and the like may be used, for example.

The decoder 26 performs a decoding process based on the user data and the parity read from the NAND 10. When the user data includes no error, the user data read from the NAND 10 is directly output to the internal bus 27, and when the user data includes an error, the user data is output to the internal bus 27 after error correction using the parity is performed.

Figure 2:
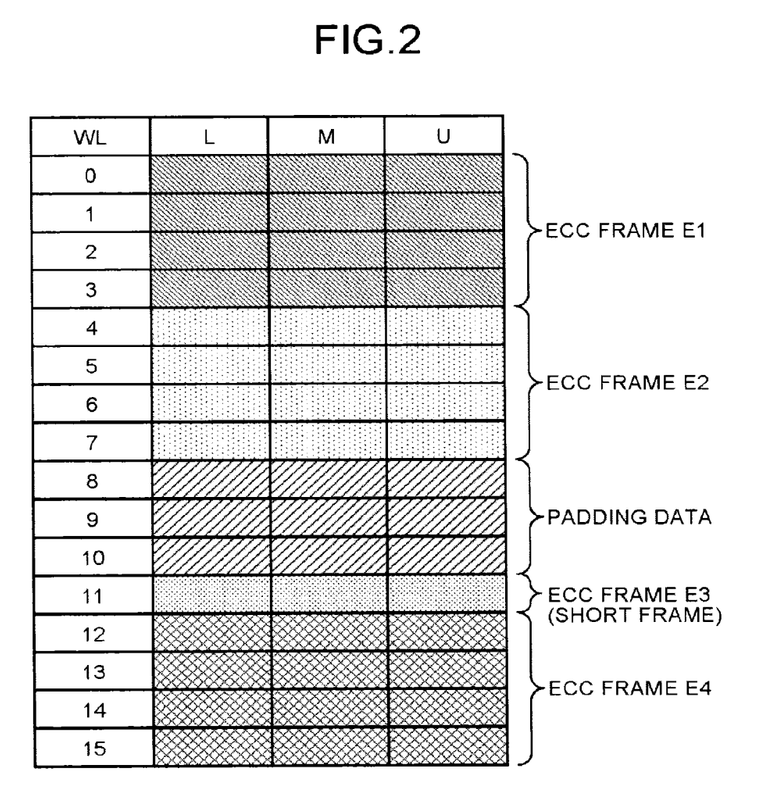
FIG. 2 is a conceptual diagram of an example of an ECC frame in a TLC NAND flash memory.

An ECC (error correcting code) frame in a TLC NAND 10 is described with reference to FIG. 2. FIG. 2 illustrates a storage area in one block. One block is formed of a plurality of memory cells connected to a plurality of word lines WL0 to WLn. In one memory cell, three-bit data is stored. A lower page (L), a middle page (M), and an upper page (U) are assigned to the three bits. FIG. 2 illustrates the storage area connected to WL0 to WL15.

In FIG. 2, the ECC (error correcting code) frame is formed so as to include the data of a plurality of pages connected to four consecutive word lines. The ECC frame may also be formed so as to extend across a plurality of blocks. In this case, the ECC frame is formed such that the data is stored in a part of a plurality of blocks and the parity is stored in another block. The data is stored in the block illustrated in FIG. 2 and the data and the parity are stored in a plurality of other blocks not illustrated.

Meanwhile, it is also possible to form the ECC frame of a plurality of pages in one block and store the data and the parity in the ECC frame. In the following description, the ECC frame is formed so as to extend across a plurality of blocks and the data is stored in the block illustrated in FIG. 2.

In FIG. 2, 12 pages from the lower page of WL0 to the upper page of WL3 belong to an ECC frame E1 first created. Also, 12 pages from the lower page of WL4 to the upper page of WL7 belong to an ECC frame E2 secondary created. Suppose that a power shutdown sequence or a stand-by instruction from the host 1 occurs at a time point at which the data is written to the ECC frame E2. In the TLC or the MLC NAND 10, the reliability of a specific WL declines when a subsequent WL following the specific WL is in an erased state or is in a halfway-written state.

Therefore, when writing ends partway through a block due to a power shutdown or the like, in order to fix the data in which writing has been completed, or in order to ensure the reliability of the data in which writing has been completed, padding data Pd is written for a predetermined number of word lines from the word line following the word line which belongs to the ECC frame that has been written last, prior to the power shutdown. The number of word lines to which the padding data Pd is written is set to be smaller than the number of word lines forming the ECC frame. In this embodiment, the padding data Pd for fixing the writing data is written to three word lines from WL8 to WL10. It is possible to prevent deterioration in reliability of the data of WL7 by the writing of the padding data Pd to WL8, WL9 and WL10. After the padding data Pd is written to WL8, WL9 and WL10, the power shutdown sequence is executed. Herein, the reliability of the padding data Pd written to WL8, WL9 and WL10 is low because WL11 being the next word line is in the erased state.

Suppose that power is turned on thereafter and the data is written to WL11 to WL15 onward. As described above, the reliability of the padding data Pd written to WL8, WL9 and WL10 is low. Therefore, if the ECC frame created thirdly is formed so as to include the padding data Pd of WL8 to WL10 and the data of WL11 and the parity is created from the data of WL8 to WL11, error correcting capability thereof is deteriorated. Therefore, in this embodiment, the padding data Pd of WL8 to WL10 is excluded from the ECC frame created thirdly and the ECC frame E3 created thirdly is created from the data of WL11. That is to say, the ECC frame E3 is created from a short frame shorter than usual. In this embodiment, a normal ECC frame is formed of four word lines and three word lines of padding data Pd is added, so that the short frame is formed of one word line of data.

A fourth ECC frame E4 is created by using the data of 12 pages from the lower page of WL12 to the upper page of WL15.

Figure 3:
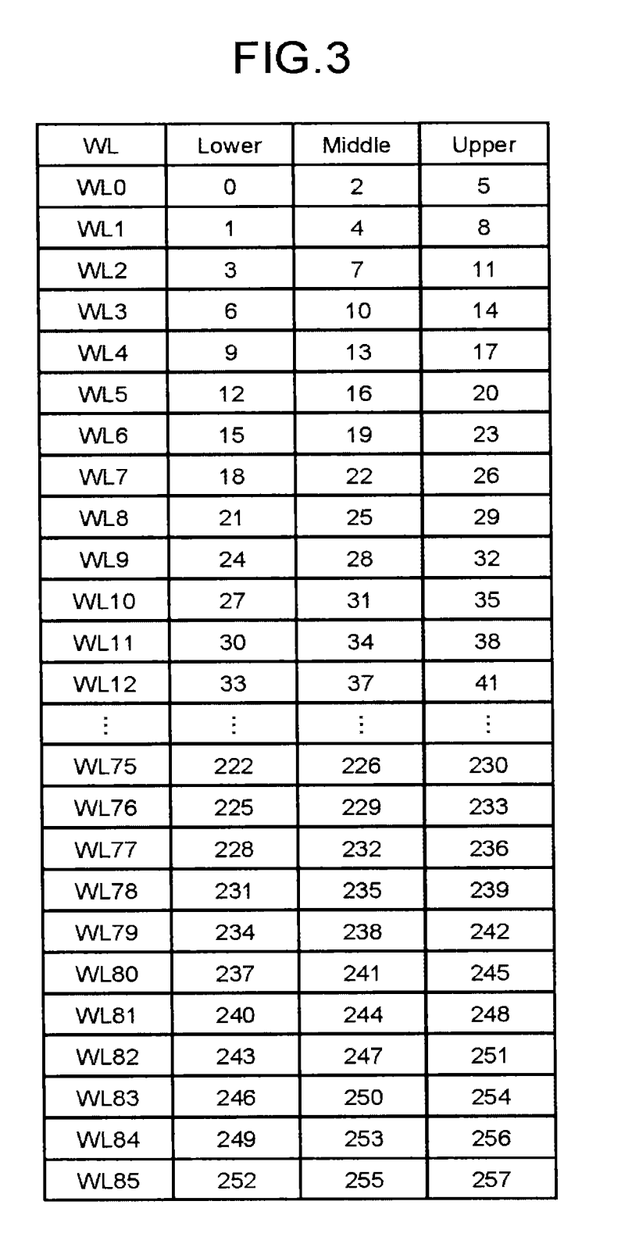
FIG. 3 is a view of order of writing of the TLC NAND flash memory.

Order of writing to the TLC NAND 10 is next described with reference to FIG. 3. In FIG. 3, the order of writing to one block is illustrated. In a case of FIG. 3, one block is formed of 258 pages from page 0 to page 257. The number assigned in FIG. 3 indicates the order of writing. Although a page number corresponds to the number indicating the order of writing for the purpose of description in this embodiment, another method of assigning the page number may also be adopted.

As illustrated in FIG. 3, the writing is performed to each page in the following order: a lower page 0 of WL0, a lower page 1 of WL1, a middle page 2 of WL0, a lower page 3 of WL2, a middle page 4 of WL1, an upper page 5 of WL0, a lower page 6 of WL3, a middle page 7 of WL2, an upper page 8 of WL1, . . . , a lower page 252 of WL85, a middle page 253 of WL84, an upper page 254 of WL83, a middle page 255 of WL85, an upper page 256 of WL84, and an upper page 257 of WL85. That is to say, when the lower page, the middle page, and the upper page are represented as L, M, and U, respectively, the writing is performed in the following order of pages: L, L, M, L, M, U, L, M, U, . . . , L, M, U, M, U, and U.

In this manner, in the TLC NAND 10, the writing is performed in the order of the lower page of a word line (n+2), the middle page of a word line (n+1), and the upper page of a word line (n) except at the head and end of the block.

Figure 4:
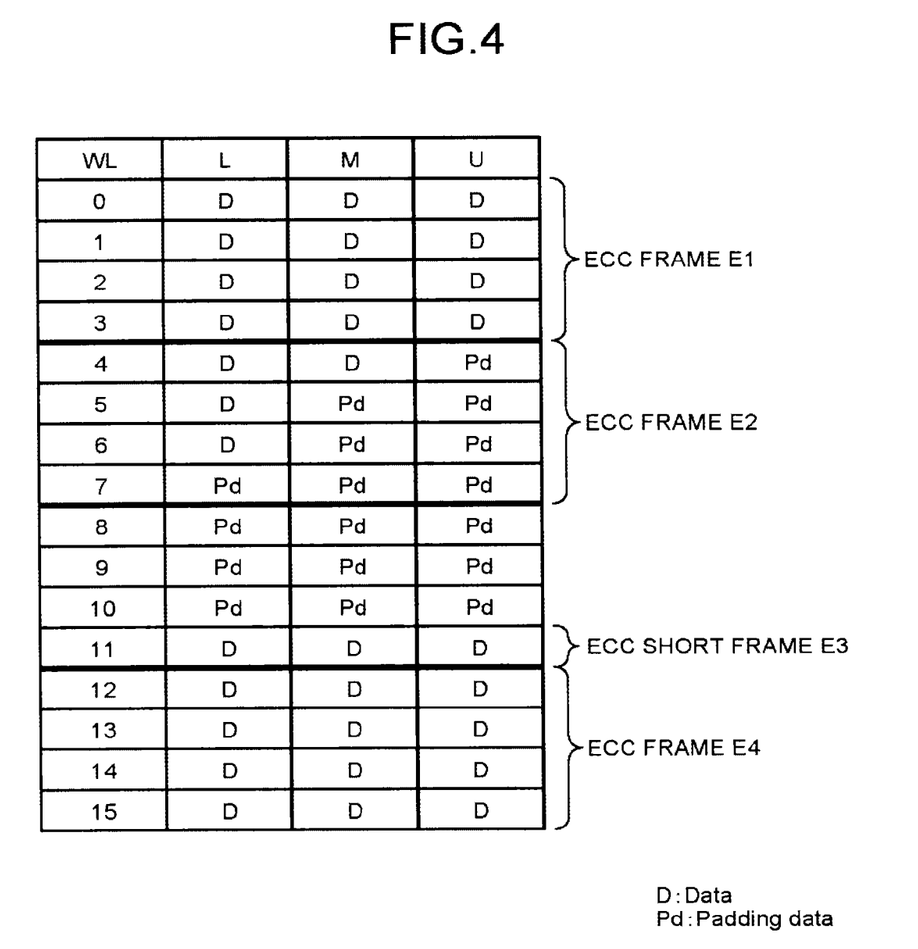
FIG. 4 is a view of a content of data in the ECC frame in the TLC NAND flash memory.

The order of writing of data D and the padding data Pd to the TLC NAND 10 is next described with reference to FIG. 4. Suppose that the writing is finished and the power shutdown sequence occurs when the data D is written to the lower page of WL0, the lower page of WL1, the middle page of WL0, the lower page of WL2, the middle page of WL1, the upper page of WL0, . . . , the lower page of WL5, the middle page of WL4, the upper page of WL3, and the lower page of WL6.

In this state, the data is not written to an entire ECC frame E2 formed of WL4 to WL7, so that the padding data Pd is written to the ECC frame E2. In more detail, the padding data Pd is written in the order of the middle page of WL5, the upper page of WL4, the lower page of WL7, the middle page of WL6, the upper page of WL5, the lower page of WL5, the middle page of WL7, the upper page of WL6, the lower page of WL9, the middle page of WL8, and the upper page of WL7. According to this, the ECC frame E2 may be filled with the padding data Pd. In order to secure the reliability of the data of WL7, it is required to write the data to all the pages of next WL8. Therefore, the padding data Pd is thereafter written to the lower page of WL10, the middle page of WL9, and the upper page of WL8. Thereafter, the power shutdown sequence is executed.

Suppose that the power is turned on thereafter and the data D is written to WL11 to WL15 onward. The writing is performed in the following order. The data D is written to the lower page of WL11, the padding data Pd is written to the middle page of WL10, the padding data Pd is written to the upper page of WL9, the data D is written to the lower page of WL12, the data D is written to the middle page of WL11, the padding data Pd is written to the upper page of WL10, the data D is written to the lower page of WL13, the data D is written to the middle page of WL12, the data D is written to the upper page of WL11, and the data D is hereinafter written in similar order.

Figure 5:
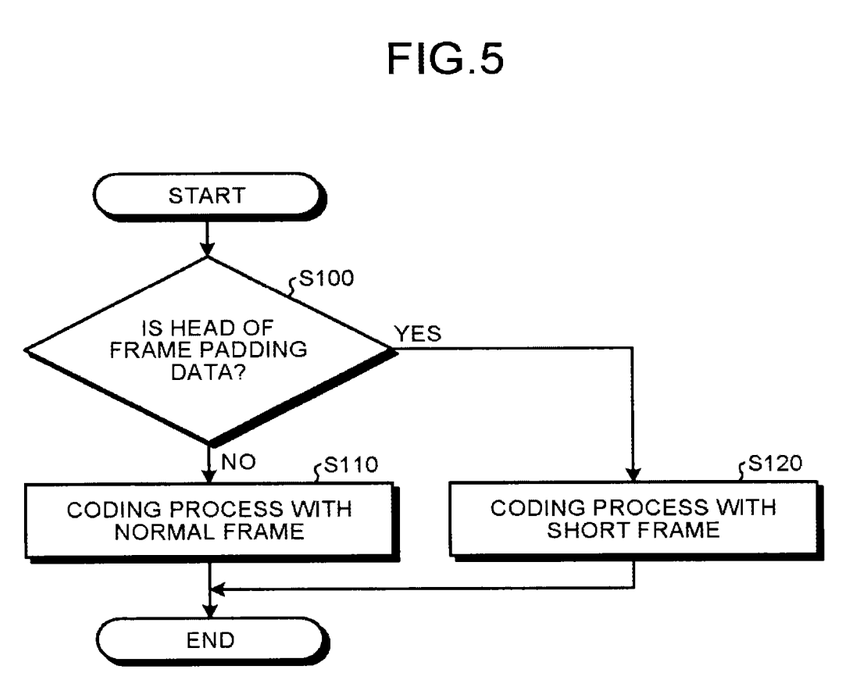
FIG. 5 is a flowchart of an operation procedure of a coding process in a first embodiment.

FIG. 5 is a flowchart of an operation procedure of the coding process. When the coder 25 performs coding, the control unit 23 determines whether the data of a head page (start page) of the ECC frame is the padding data Pd each time the ECC frame is created (step S100). As a result of the determination, when the head of the frame is not the padding data Pd but the normal data D, the control unit 23 gives the coder 25 an instruction to perform the coding process with the normal ECC frame including four word lines of page data. According to this, the coder 25 executes the coding process with the normal ECC frame (step S110).

On the other hand, when it is determined that the head of the frame is the padding data Pd at step S100, the control unit 23 gives the coder 25 an instruction to perform the coding process with the short frame. According to this, the coder 25 excludes the three word lines of padding data Pd from the ECC frame and executes the coding process with the short frame including one word line of data D (step S120).

Figure 6:
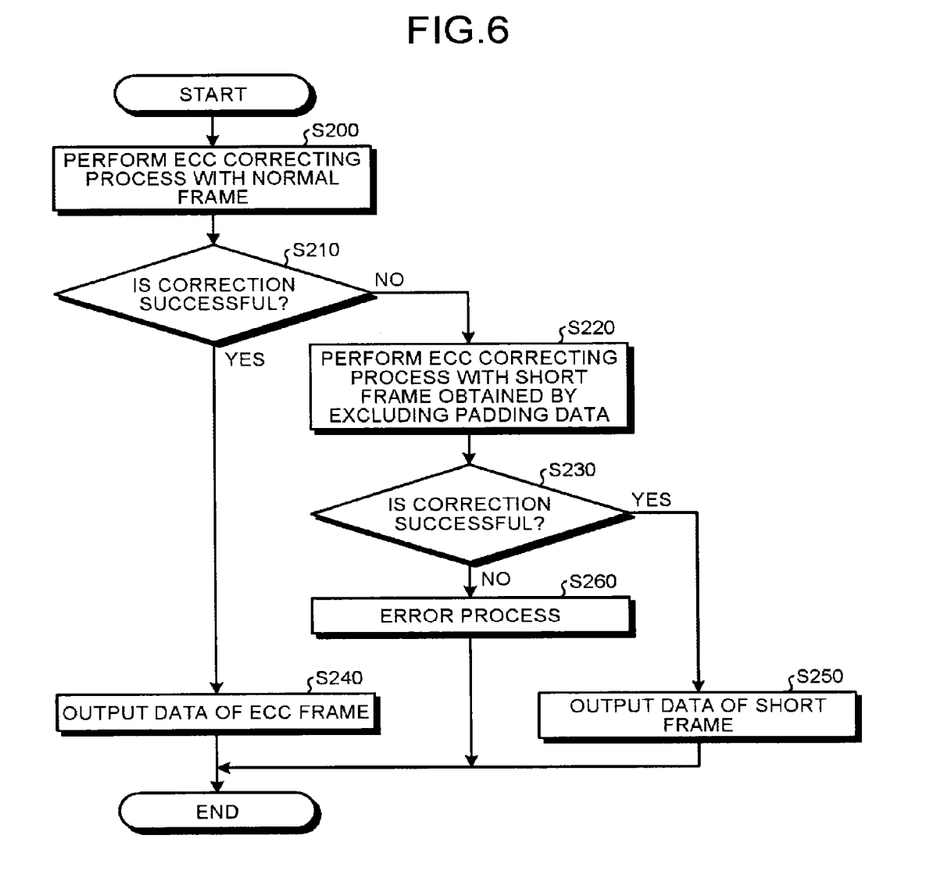
FIG. 6 is a flowchart of an operation procedure of a decoding process in the first embodiment.

FIG. 6 is a flowchart of an operation procedure of the decoding process. When the decoder 26 detects the error in the user data, the decoder 26 executes an error correcting process with the data and the parity forming the ECC frame (step 3200). When the error can be corrected by the error correcting process (step S210: Yes), the data included in the ECC frame is output to the internal bus 27 (step S240).

However, when the error cannot be corrected by the error correcting process with the ECC frame, the control unit 23 gives the decoder 26 an instruction to execute the error correcting process with the short frame obtained by excluding the padding data Pd (step S220). In the ECC frame, a size and a position of a padding data area are fixed. Therefore, the decoder 26 may specify a short frame area obtained by excluding the padding data area from the ECC frame and the decoder 26 executes the error correcting process with the short frame. When the error correcting process is successful with the short frame, the decoder 26 outputs the data included in the short frame to the internal bus 27 (step S250). When the error correction cannot be performed also with the short frame, the control unit 23 executes a predetermined error process which should be performed when the error correction ends in failure (step S260).

In a case in which the coding is performed with the short frame, when the decoding is performed with the ECC frame including a short frame part and the padding data, the error correcting process must end in failure, so that it is determined No at step S210. Therefore, in a case in which the coding is performed with the short frame, if the error correcting process is thereafter performed only with the short frame part at step S220, the error correcting process must be successful. Since the short frame does not include the padding data with low reliability, this does not deteriorate correcting capability of the error correcting code.

In this manner, in the embodiment, when the writing is finished partway through the block, the ECC frame is formed so as to include the write data and a fixed amount of padding data Pd is added to a subsequent page of the ECC frame. When the padding data Pd is added to the subsequent page of the ECC frame, the coding process is performed based on the short frame obtained by excluding the fixed amount of padding data Pd from the ECC frame, so that the padding data Pd with the low reliability is not included in the ECC frame and it becomes possible to improve the correcting capability of the error correcting code.

At the time of the decoding, the decoding is first performed with the normal ECC frame, and when the decoding ends in failure, the decoding is performed with the short frame, so that it is possible to appropriately decode both of the normal ECC frame and the short frame regardless of whether the padding data is included in a decoding target.

Meanwhile, it is not clear whether the ECC frame to be decoded is the normal ECC frame or the short frame in the decoding procedure illustrated in FIG. 6, so that the decoding process is first performed with the normal ECC frame, and when the decoding process ends in failure, the decoding process is performed with the short frame. It is also possible to allow each ECC frame to have discrimination information to discriminate whether the ECC frame is the normal ECC frame or the short frame. At the time of decoding, the control unit 23 refers to the discrimination information, and when the ECC frame is the normal ECC frame, this allows the decoding process to be performed with the normal ECC frame, and when the ECC frame is the short frame, this allows the decoding process to be performed with the short frame.

Although the ECC frame is formed of the four word lines and the three word lines of padding data is added so as to secure the reliability of the write data in the above-described embodiment, the number of word lines forming the ECC frame, the number of word lines of the padding data to be added, and the number of word lines forming the short frame are optional and other values may also be adopted. That is to say, when p and q are natural numbers, the ECC frame includes data of the pages connected to p word lines, the short frame includes data of the pages connected to q (q<p) word lines, and the padding data Pd is written to (p−q) word lines interposed between the p word lines and the q word lines.

Figure 7:
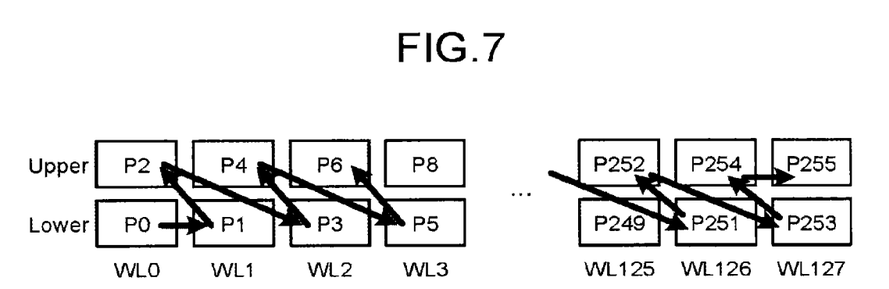
FIG. 7 is a view of order of writing of an MLC NAND flash memory.

Although the embodiment is described above by using the TLC NAND, this embodiment may also applied to the MLC NAND. In the MLC NAND 10, the writing is performed in order illustrated in FIG. 7, for example. In more detail, the order of write operation from page 0 (P0) to page 255 (P255) is L, L, U, L, U, L, U, . . . , L, U, and U.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a non-volatile memory including a plurality of blocks, each of the blocks including a plurality of word lines and a plurality of memory cells, each of the word lines being connected to the memory cells, each of the memory cells belonging to a plurality of pages; and a controller configured to perform a coding process based on a first frame including data of the pages connected to first word lines, the first word lines being a predetermined number of consecutive word lines in the block, perform, when padding data is written to the pages connected to second word lines, the second word lines being the predetermined number of consecutive word lines subsequent to the first word lines, a coding process based on a second frame, the second frame being obtained by excluding the padding data from a frame including data of the pages connected to the second word lines, and perform, when padding data is not written to the pages connected to the second word lines, a coding process based on a third frame, the third frame including data of the pages connected to the second word lines.

2. The memory system according to claim 1, wherein when p and q are natural numbers, the first frame belongs to p word lines and the second frame belongs to q (q<p) word lines, and the controller is configured to write the padding data to the pages connected to (p−q) word lines, the (p−q) word lines being interposed between the p word lines and the q word lines.

3. The memory system according to claim 2, wherein each of the memory cells is capable of storing three bits, and wherein the controller writes, in writing order of a lower page of a word line (n+2), a middle page of a word line (n+1), and an upper page of a word line (n), where n is zero or a natural number, and wherein the controller writes, after writing data to a page among the pages connected to the first word lines and receiving a power down instruction, the padding data to an non-written page among the pages connected to the first word lines.

4. The memory system according to claim 2, wherein each of the memory cells is capable of storing two bits, and the controller writes in order of a lower page of a word line (n+1) and an upper page of a word line (n) where n is zero or a natural number, and wherein the controller writes, after writing data to a page among the pages connected to the first word lines and receiving a power down instruction, the padding data to an non-written page among the pages connected to the first word lines.

5. The memory system according to claim 1, wherein the controller is configured to determine to perform the coding process based on the second frame when the padding data is written to a start page of the second word lines.

6. The memory system according to claim 1, wherein the controller is configured to perform a decoding process based on the third frame, and perform the decoding process based on the second frame when failing in the decoding process based on the first frame.

7. The memory system according to claim 1, wherein the controller is configured to manage discrimination information indicating whether coding is performed with the second frame or the coding is performed with the third frame, and determine whether to perform decoding based on the second frame or to perform the decoding based on the third frame according to the discrimination information.

8. The memory system according to claim 1, wherein the non-volatile memory is a NAND flash memory.

9. A control method of controlling a non-volatile memory including a plurality of blocks, each of the blocks including a plurality of word lines and a plurality of memory cells, each of the word lines being connected to a plurality of the memory cells, each of the memory cells belonging to a plurality of pages, the method comprising performing a coding process based on a first frame including data of the pages connected to first word lines, the first word lines being a predetermined number of consecutive word lines in the block, performing, when padding data is written to a plurality of pages connected to second word lines, the second word lines being the predetermined number of consecutive word lines subsequent to the first word lines, a coding process based on a second frame, the second frame being obtained by excluding the padding data from a frame including data of the pages connected to the second word lines, and perform, when padding data is not written to the pages connected to the second word lines, a coding process based on a third frame, the third frame including data of the pages connected to the second word lines.

10. The method according to claim 9, wherein when p and q are natural numbers, the first frame belongs to p word lines and the second frame belongs to q (q<p) word lines, the method further comprising writing the padding data to the pages connected to (p−q) word lines, the (p−q) word lines being interposed between the p word lines and the q word lines.

11. The method according to claim 10, wherein each of the memory cells is capable of storing three bits, the method further comprising writing in order of a lower page of a word line (n+2), a middle page of a word line (n+1), and an upper page of a word line (n), where n is zero or a natural number, and writing, after writing data to a page among the pages connected to the first word lines and receiving a power down instruction, the padding data to an non-written page among the pages connected to the first word lines.

12. The method according to claim 10, wherein each of the memory cells is capable of storing two bits, the method further comprising writing in order of a lower page of a word line (n+1) and an upper page of a word line (n), where n is zero or a natural number, and writing, after writing data to a page among the pages connected to the first word lines and receiving a power down instruction, the padding data to an non-written page among the pages connected to the first word lines.

13. The method according to claim 9, further comprising determining to perform the coding process based on the second frame when the padding data is written to a start page of the second word lines.

14. The method according to claim 9, further comprising performing a decoding process based on the third frame, and performing the decoding process based on the second frame when failing in the decoding process based on the first frame.

15. The method according to claim 9, further comprising managing discrimination information indicating whether coding is performed with the second frame or the coding is performed with the third frame, and determining whether to perform decoding based on the second frame or to perform the decoding based on the third frame according to the discrimination information.

16. The method according to claim 9, wherein the non-volatile memory is a NAND flash memory.

* * * * *